(12) United States Patent
Chen et al.

(10) Patent No.: US 11,874,609 B2
(45) Date of Patent: *Jan. 16, 2024

(54) TEMPERATURE CONTROL DEVICE AND TEMPERATURE CONTROL METHOD

(71) Applicant: CHANGXIN MEMORY TECHNOLOGIES, INC., Hefei (CN)

(72) Inventors: Enhao Chen, Hefei (CN); Zhiyong Hu, Hefei (CN); Jinping Sun, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/712,378

(22) Filed: Apr. 4, 2022

(65) Prior Publication Data

US 2023/0100048 A1 Mar. 30, 2023

(30) Foreign Application Priority Data

Sep. 29, 2021 (CN) .......................... 202111150162.X

(51) Int. Cl.
*G03F 7/20* (2006.01)
*G03F 7/00* (2006.01)

(52) U.S. Cl.
CPC ........ *G03F 7/70891* (2013.01); *G03F 7/7075* (2013.01); *G03F 7/70875* (2013.01); *G03F 7/70991* (2013.01)

(58) Field of Classification Search
CPC ...... G03F 7/70991; G03F 7/70; G03F 7/7085; G03F 7/70858–70891;

(Continued)

(56) References Cited

U.S. PATENT DOCUMENTS 5,914,493 A * 6/1999 Morita .................. G03F 7/2065
250/443.1
5,996,353 A 12/1999 Maxwell
(Continued)

FOREIGN PATENT DOCUMENTS

CN 1849561 A 10/2006
CN 1940729 A 4/2007
(Continued)

OTHER PUBLICATIONS

English translation of CN111725090, published Sep. 29, 2020. (Year: 2020).*

(Continued)

*Primary Examiner* — Christina A Riddle
(74) *Attorney, Agent, or Firm* — Cooper Legal Group, LLC

(57) ABSTRACT

A temperature control device and a temperature control method are provided. The temperature control device is located at an interface between a photoresist coating and developing machine and a lithography machine and includes: a temperature detection device, a gas flow generator and a controller. The temperature detection device and the gas flow generator are respectively connected to the controller. The temperature detection device is configured to detect an actual temperature at the interface in real time. The gas flow generator is at least configured to generate a gas flow sealing knife around the interface. The controller is configured to control the gas flow generator to generate the gas flow sealing knife responsive to that the actual temperature detected by the temperature detection device is not equal to the target temperature, to control the actual temperature at the interface to reach the target temperature through the gas flow sealing knife.

16 Claims, 9 Drawing Sheets

(58) Field of Classification Search
CPC . G03F 7/70908–70941; G03F 7/70975; G03F 7/70783; G03F 7/70733; G03F 7/7075; G03F 7/70691; G03F 7/70483–705; G03F 7/70508; G03F 7/70525; G05D 23/1931; H01L 21/67155; H01L 21/67161; H01L 21/67173; H01L 21/67184; H01L 21/6719; H01L 21/67196; H01L 21/67201; H01L 21/67225; H01L 21/67098; H01L 21/67103; H01L 21/67109; H01L 21/67739; H01L 21/67745; H01L 21/67248
USPC .............. 355/18, 27, 30, 52–55, 67–77, 133
See application file for complete search history.

(56) References Cited

U.S. PATENT DOCUMENTS

| | | | | |
|---|---|---|---|---|
| 6,638,672 | B2* | 10/2003 | Deguchi | ............... G03F 7/7075 430/30 |
| 10,838,311 | B2* | 11/2020 | Nakano | ................... G03F 7/168 |
| 2001/0043314 | A1* | 11/2001 | Ota | ......................... G03F 7/707 430/30 |
| 2005/0057733 | A1 | 3/2005 | Owen | |
| 2006/0204356 | A1* | 9/2006 | Yamagishi | ........ H01L 21/67778 414/749.1 |
| 2007/0046911 | A1* | 3/2007 | Aichi | .................. G03F 7/70716 355/53 |
| 2007/0070324 | A1 | 3/2007 | Kuit | |
| 2020/0110343 | A1 | 4/2020 | Nakano | |
| 2023/0061927 | A1* | 3/2023 | Chen | ................... G03F 7/70858 |
| 2023/0100048 | A1 | 3/2023 | Chen | |

FOREIGN PATENT DOCUMENTS

| | | | | |
|---|---|---|---|---|
| CN | 102193565 | A | | 9/2011 |
| CN | 103576463 | A | | 2/2014 |
| CN | 203773225 | U | | 8/2014 |
| CN | 110297399 | A | * 10/2019 ......... G03F 7/70875 |
| CN | 110297399 | A | | 10/2019 |
| CN | 110361938 | A | | 10/2019 |
| CN | 110966916 | A | | 4/2020 |
| CN | 111025850 | A | | 4/2020 |
| CN | 111725090 | A | * 9/2020 |
| CN | 111725090 | A | | 9/2020 |
| CN | 111812951 | A | | 10/2020 |

OTHER PUBLICATIONS

English translation of CN-110297399-A, published Oct. 1, 2019. (Year: 2019).*

International Search Report in the international application No. PCT/CN2021/130574, dated May 11, 2022. 3 pages.

Non-Final Office Action of the U.S. Appl. No. 17/809,154, dated May 11, 2023. 99 pages.

* cited by examiner

TEMPERATURE CONTROL DEVICE AND TEMPERATURE CONTROL METHOD

CROSS-REFERENCE TO RELATED APPLICATION

The present application claims priority to Chinese Patent Application No. 202111150162.X, filed on Sep. 29, 2021, the disclosure of which is hereby incorporated by reference in its entirety.

BACKGROUND

The lithography process in semiconductor technology is the circulating production line operation including photoresist coating, exposure, and development completed by an integrated machine made by connection of a coating machine with a lithography machine at a high speed. After photoresist coating and baking process before high temperature exposure, a wafer will first enter an interface block chill plate (iCPL) for annealing treatment, so that the temperature of the wafer is reduced to room temperature, and the stress of the wafer due to the front-end-of-line is released, to recover the deformation. Then the wafer enters the temperature stable unit (TSU) of the lithography machine via an interface between the coating machine and the lithography machine to control the temperature, so that the wafer maintains a constant temperature for alignment and exposure actions, ensuring that the overlaying error and line width are stable.

However, the interface is a link without temperature control. The wafer will enter the TSU with different temperatures at the interface. If the TSU temperature control time is not enough, the wafer stress is not released in time, the deformation of the wafer will affect the authenticity and stability of the overlaying error during the alignment of the lithography machine, even exceeding the product specification, which requires rework and thus reduces the production line productivity. If the TSU temperature control time is longer, the lithography machine productivity will be reduced.

SUMMARY

The present disclosure relates to semiconductor technology, and relates to, but is not limited to, a temperature control device and a temperature control method.

In the first aspect, there is provided a temperature control device located at an interface between a photoresist coating and developing machine and a lithography machine. The temperature control device includes: a temperature detection device, a gas flow generator and a controller.

The temperature detection device and the gas flow generator are respectively connected to the controller.

The temperature detection device is configured to detect an actual temperature at the interface in real time.

The gas flow generator is at least configured to generate a gas flow sealing knife around the interface.

The controller is configured to control the gas flow generator to generate the gas flow sealing knife responsive to that the actual temperature detected by the temperature detection device is not equal to a target temperature, to control the actual temperature at the interface to reach the target temperature through the gas flow sealing knife.

In the second aspect, the embodiments of the present disclosure provide a temperature control method. The method is applied to the above temperature control device. The temperature control device at least includes: a temperature detection device and a gas flow generator. The method includes the following operations.

A target temperature at an interface between a photoresist coating and developing machine and a lithography machine is determined.

An actual temperature at the interface is acquired in real time through the temperature detection device.

A gas flow sealing knife around the interface is at least generated through the gas flow generator in the case where the actual temperature is not equal to the target temperature, to control the actual temperature at the interface to reach the target temperature through the gas flow sealing knife.

BRIEF DESCRIPTION OF THE DRAWINGS

In the accompanying drawings, which are not necessarily drawn to scale, similar reference numerals may describe similar parts in the different views. Similar reference numbers with different letter suffixes may denote different instances of similar components. The accompanying drawings generally illustrate, by way of example and not limitation, the various embodiments discussed herein.

DETAILED DESCRIPTION

Figure 1:
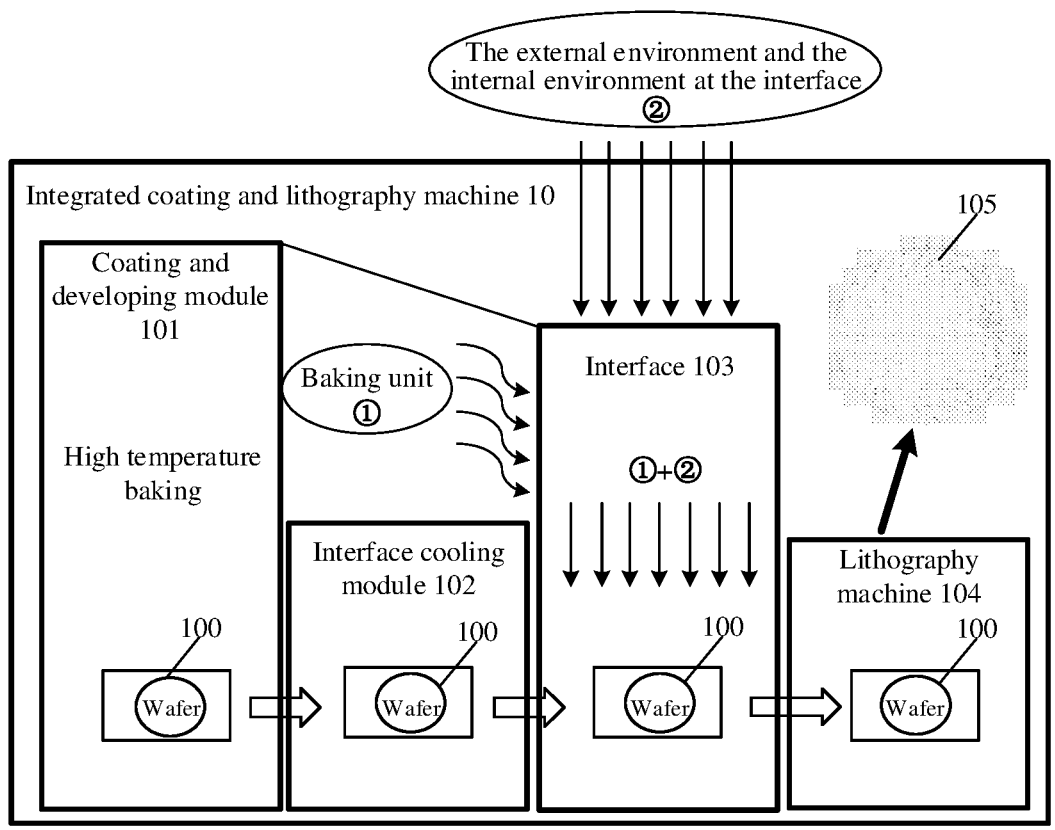
FIG. 1 illustrates a schematic diagram of various modules in the integrated coating and lithography machine in the related art.

Exemplary embodiments disclosed in the present disclosure will be described in more detail below with reference to the accompanying drawings. Although exemplary embodiments of the present disclosure are illustrated in the drawings, it should be understood that the present disclosure may be embodied in various forms and should not be limited to the specific implementations set forth herein. Rather, these embodiments are provided so that the present disclosure will be more thoroughly understood, and will fully convey the scope of the present disclosure to a person skilled in the art.

In the following description, numerous specific details are given in order to provide a more thorough understanding of the present disclosure. It will be apparent, however, to a person skilled in the art that the present disclosure may be practiced without one or more of these details. In other examples, some technical features that are well known in the art have not been described in order to avoid confusion with the present disclosure; that is, not all features of an actual embodiment are described herein, and well-known functions and structures are not described in detail.

In the accompanying drawings, the sizes of layers, areas, elements, and their relative sizes may be exaggerated for clarity. The same reference numbers refer to the same elements throughout the disclosure.

It should be understood that when an element or layer is referred to as being "on", "adjacent to", "connected to", or "coupled to" another element or layer, it can be directly on the another element or layer, adjacent thereto, connected or coupled to the another element or layer, or intervening elements or layers may be present. In contrast, when an element is referred to as being "directly on", "directly adjacent to", "directly connected to", or "directly coupled to" another element or layer, the intervening elements or layers are not present. It should be understood that, although the terms "first", "second", "third", etc. may be used to describe various elements, components, areas, layers and/or parts, these elements, components, areas, layers and/or parts should not be limited by these terms. These terms are only used to distinguish one element, component, area, layer or part from another element, component, area, layer or part. Therefore, a first element, component, area, layer or part discussed below can be represented as a second element, component, area, layer or part without departing from the teachings of the present disclosure. However, the discussion of a second element, component, area, layer or part does not imply that the first element, component, area, layer or part is necessarily present in the present disclosure.

The terms used herein are for the purpose of describing specific embodiments only and is not intended to be limitation of the present disclosure. As used herein, the singular forms "a", "an", and "the/said" are intended to include the plural forms as well, unless the context clearly dictates otherwise. It should also be understood that the terms "compose" and/or "include", when used in this specification, identify the presence of the features, integers, steps, operations, elements and/or components, but do not exclude the presence or addition of one or more other features, integers, steps, operations, elements, components and/or groups. As used herein, the term "and/or" includes any and all combinations of the associated listed items.

FIG. 1 illustrates a schematic diagram of various modules in the integrated coating and lithography machine in the related art. The coating and lithography process in the related art will be described below with reference to FIG. 1. As illustrated in FIG. 1, an integrated coating and lithography machine 10 in the related art mainly includes four modules, namely, a coating and developing module 101, an interface cooling module 102, an interface 103 and a lithography machine 104. The wafer 100 is first subjected to photoresist coating and baking processes in the coating and developing module 101; then the wafer 100 enters the interface cooling module 102 for annealing treatment, so that the temperature of the wafer is cooled to room temperature, and the stress of the wafer due to the front-end-of-line is released, to recover the deformation; then, the wafer 100 passes through the interface 103 of the integrated coating and lithography machine 10, and enters the temperature stable unit of the lithography machine 104 for temperature control, thereby performing a pre-alignment step before exposure. In the related art, if the precise alignment between the wafer and the lithography mask cannot be achieved, the measurement structure of the overlaying error (Overlay) between the wafer and the lithography mask will take the form of a spiral map 105.

In the process of realizing the present disclosure, the inventor has found that there are at least the following problems in the related art: in the related art, the interface 103 is a part without temperature control, and the wafer 100 at the interface 103 is easily affected by the baking unit ①, and environment outside the factory and the internal environment at the interface ②, resulting in the wafer 100 entering the TSU with different temperatures at the interface 103. If the TSU temperature control time is not enough, the stress of the wafer 100 is not released in time, and the deformation of the wafer 100 will affect the authenticity and stability of the overlaying error during the alignment of the lithography machine, and even exceed the product specification, which requires rework and reduces the production line productivity. If the TSU temperature control time is longer, the lithography machine productivity will be reduced.

Based on the problems existing in the related art, the embodiments of the present disclosure provide a temperature control device and a temperature control method. Since the temperature control device according to the embodiments of the present disclosure is located at the interface between the photoresist coating and developing machine and the lithography machine, the wafer at the interface between the photoresist coating and developing machine and the lithography machine can have a suitable temperature, and thus the temperature control time of the wafer in the TSU can be reduced, and the productivity of the lithography machine can be improved.

Figure 2:
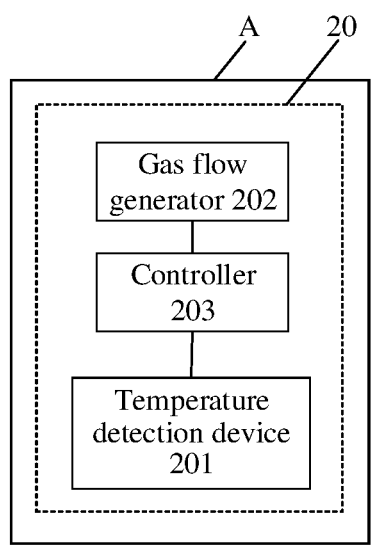
FIGS. 2 to 7 illustrate structural diagrams of a temperature control device according to an embodiment of the present disclosure.

FIGS. 2 to 7 illustrate structural diagrams of a temperature control device according to an embodiment of the present disclosure. As illustrated in FIG. 2, the temperature control device 20 is located at an interface A between a photoresist coating and developing machine and a lithography machine; and the temperature control device 20 includes a temperature detection device 201, a gas flow generator 202 and a controller 203.

The temperature detection device 201 and the gas flow generator 202 are respectively connected to the controller 203. In the embodiments of the present disclosure, the temperature detection device 201 and the controller 203 may be wired or wirelessly connected to each other, and the gas flow generator 202 and the controller 203 may be wired or wirelessly connected to each other.

The temperature detection device 201 is configured to detect the actual temperature at the interface A between the photoresist coating and developing machine and the lithography machine in real time. The gas flow generator 202 is located on top inside the interface, and the gas flow generator 202 is at least configured to generate a gas flow sealing knife around the interface. In the embodiments of the present disclosure, the gas flow generator 202 may be an air shower device or a fan.

The controller 203 is configured to control the gas flow generator 202 to generate the gas flow sealing knife responsive to that the actual temperature detected by the temperature detection device 201 is not equal to the target temperature, to control the actual temperature at the interface to reach the target temperature through the gas flow sealing knife.

In the embodiments of the present disclosure, the gas flow sealing knife generated by the gas flow generator 202 can be configured to isolate the interface A between the photoresist coating and developing machine and the lithography machine from the external environment, and the air pressure inside the gas flow sealing knife is greater than the air pressure of the external environment, in such a way, the gas flow sealing knife can prevent the external hot gas flow (for example, the baking hot gas flow inside the photoresist coating and developing machine and the hot gas flow inside the factory) from entering inside the interface A between the photoresist coating and developing machine and the lithography machine, and therefore, a constant temperature can be maintained inside the interface A.

In some embodiments, the gas flow generator 202 is further configured to inject a temperature control gas flow to inside the interface A; the temperature control gas flow may be cold gas flow, normal temperature gas flow, or hot gas flow. Correspondingly, the controller 203 is further configured to control the gas flow generator 202 to inject the temperature control gas flow to inside the interface A responsive to that the actual temperature detected by the temperature detection device 201 is not equal to the target temperature, to control the actual temperature at the interface A to reach the target temperature through the temperature control gas flow.

In some embodiments, the actual temperature includes the ambient temperature at the interface A and the surface temperature of the wafer inside the interface A. The temperature detection device 201 includes a first detection sub-device and a second detection sub-device. The first detection sub-device is configured to detect the ambient temperature; and the second detection sub-device is configured to detect the surface temperature of the wafer inside the interface A.

Here, the first detection sub-device and the second detection sub-device may be temperature sensors or temperature measuring instruments.

Figure 3:
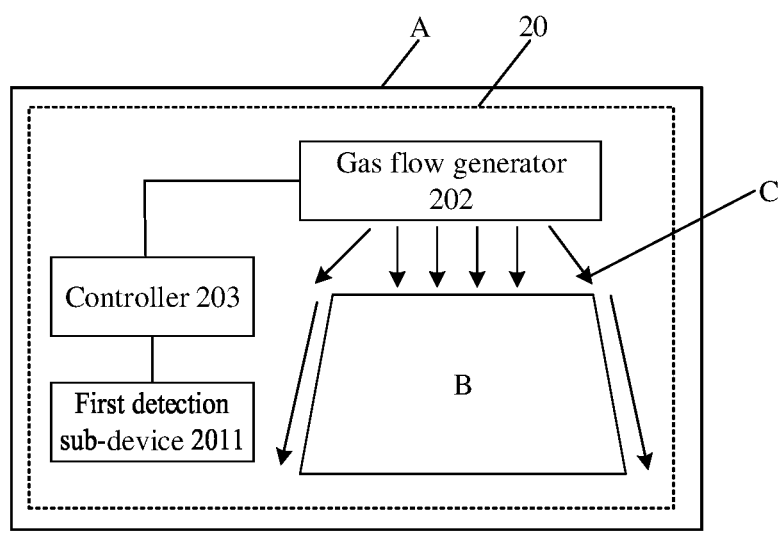

In some embodiments, as illustrated in FIG. 3, the temperature control device 20 is located at the interface A between the photoresist coating and developing machine and the lithography machine. The temperature control device 20 includes a first detection sub-device 2011, a gas flow generator 202 and a controller 203. The controller 203 is connected to the first detection sub-device 2011 and the gas flow generator 202. The controller 203 is configured to control the gas flow generator 202 to generate the gas flow sealing knife B responsive to that the ambient temperature detected by the first detection sub-device 2011 is not equal to the target temperature, so that the ambient temperature reaches the target temperature; or the controller 203 is configured to control the gas flow generator 202 to inject the temperature control gas flow C to inside the interface A responsive to that the ambient temperature detected by the first detection sub-device 2011 is not equal to the target temperature, so that the ambient temperature reaches the target temperature.

Figure 4:
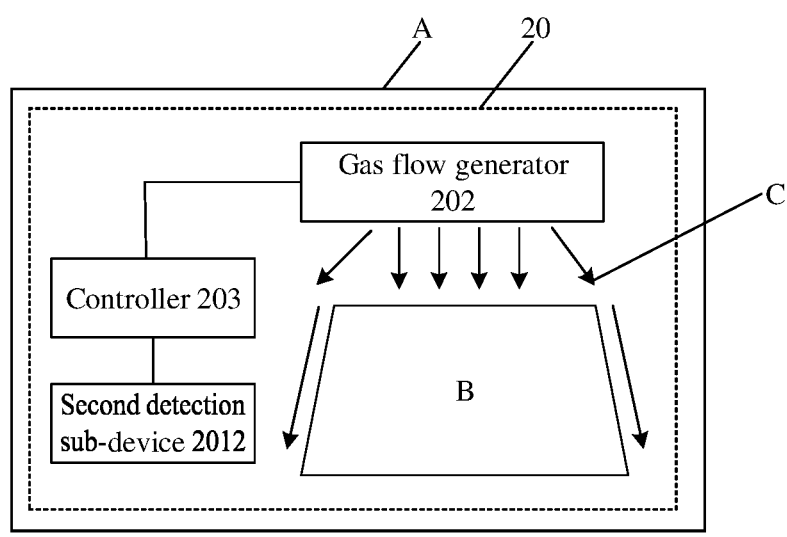

In some embodiments, as illustrated in FIG. 4, the temperature control device 20 is located at the interface A between the photoresist coating and developing machine and the lithography machine, and the temperature control device 20 includes a second detection sub-device 2012, a gas flow generator 202 and a controller 203. The controller 203 is connected to the second detection sub-device 2012 and the gas flow generator 202. The controller 203 is configured to control the gas flow generator 202 to generate the gas flow sealing knife B responsive to that the surface temperature of the wafer (not illustrated in FIG. 4) inside the interface A detected by the second detection sub-device 2012 is not equal to the target temperature, so that the surface temperature reaches the target temperature, or the controller 203 is configured to control the gas flow generator 202 to inject a temperature control gas flow C onto the surface of the wafer responsive to that the temperature of the surface of the wafer inside the interface A detected by the second detection sub-device 2012 is not equal to the target temperature, so that the surface temperature reaches the target temperature.

Figure 5:
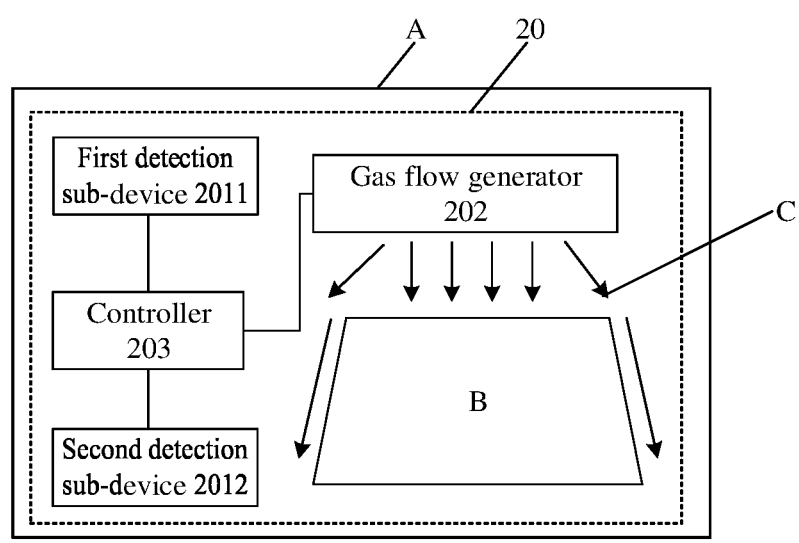

In some embodiments, as illustrated in FIG. 5, the temperature control device 20 is located at the interface A between the photoresist coating and developing machine and the lithography machine, and the temperature control device 20 includes a first detection sub-device 2011, a second detection sub-device 2012, a gas flow generator 202 and a controller 203. The first detection sub-device 2011, the second detection sub-device 2012 and the gas flow generator 202 are respectively connected to the controller 203. The controller 203 is configured to control the gas flow generator 202 to generate the gas flow sealing knife B responsive to that the ambient temperature detected by the first detection sub-device 2011 is not equal to the target temperature, so that the ambient temperature reaches the target temperature; or the controller 203 is configured to control the gas flow generator 202 to inject the temperature control gas flow C to inside the interface A responsive to that the ambient temperature detected by the first detection sub-device 2011 is not equal to the target temperature, so that the ambient temperature reaches the target temperature. The controller 203 is further configured to control the gas flow generator 202 to generate the gas flow sealing knife B responsive to that the surface temperature of the wafer (not illustrated in FIG. 5) inside the interface A detected by the second detection sub-device 2012 is not equal to the target temperature, so that the surface temperature reaches the target temperature, or the controller is further configured to control the gas flow generator 202 to inject the temperature control gas flow C onto the wafer surface responsive to that the surface temperature of the wafer inside the interface A detected by the second detection sub-device 2012 is not equal to the target temperature, so that the surface temperature reaches the target temperature.

Figure 6:
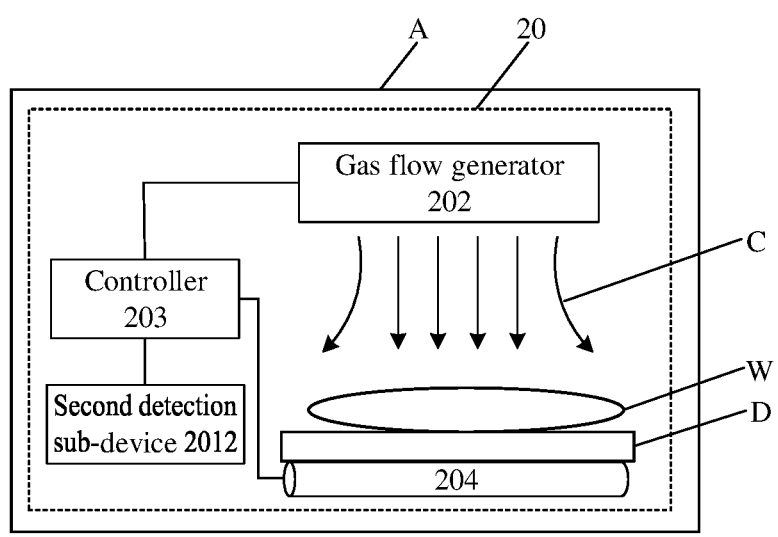

In some embodiments, as illustrated in FIG. 6, the temperature control device 20 is located at the interface A between the photoresist coating and developing machine and the lithography machine. The temperature control device 20 includes a second detection sub-device 2012, a gas flow generator 202, and a controller 203 and a temperature control pipeline 204. The controller 203 is respectively connected to the second detection sub-device 2012, the gas flow generator 202 and the temperature control pipeline 204.

In the embodiments of the present disclosure, the temperature control pipeline 204 is at least in contact with a carrier table D on which the wafer is placed, and the temperature control pipeline 204 is filled with a temperature control liquid or a temperature control gas. The controller 203 is further configured to control the temperature control pipeline 204 to operate responsive to that the surface temperature detected by the second detection sub-device 2012 is not equal to the target temperature, so that the surface temperature reaches the target temperature.

Here, the temperature control liquid may be water, such as cold water, hot water, or liquid nitrogen. The temperature control gas may be compressed air or the like. It should be noted that, the temperature control device in the embodiments of the present disclosure may be a heating device or a cooling device.

In some embodiments, the temperature control pipeline 204 is also in contact with a robotic arm (not illustrated in FIG. 6) inside the lithography machine, and the robotic arm is configured to transport the wafer W from the photoresist coating and developing machine into the lithography machine.

In some embodiments, the controller 203 is configured to control the gas flow generator 202 to generate a gas flow sealing knife (not illustrated in FIG. 6) responsive to that the surface temperature of the wafer W detected by the second detection sub-device 2012 is not equal to the target temperature, so that the surface temperature reaches the target temperature, or the controller 203 is configured to control the gas flow generator 202 to inject a temperature control gas flow C onto the surface of the wafer W responsive to that the surface temperature of the wafer W detected by the second detection sub-device 2012 is not equal to the target temperature, so that the surface temperature reaches the target temperature.

Figure 7:
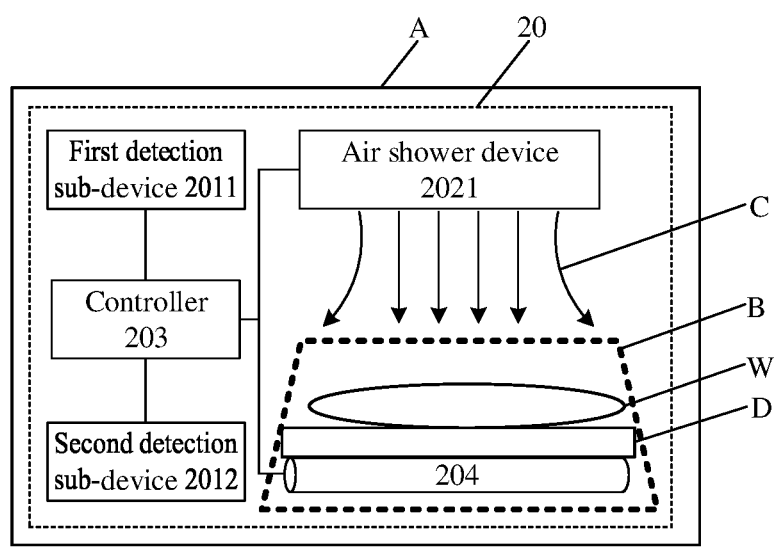

In some embodiments, as illustrated in FIG. 7, the temperature control device 20 is located at the interface A between the photoresist coating and developing machine and the lithography machine. The temperature control device 20 includes a first detection sub-device 2011, a second detection sub-device 2012, an air shower device 2021, a controller 203 and a temperature control pipeline 204. The controller 203 is respectively connected to the first detection sub-device 2011, the second detection sub-device 2012, the air shower device 2021 and the temperature control pipeline 204. The controller 203 is configured to control the gas flow generator 202 to generate the gas flow sealing knife B responsive to that the ambient temperature detected by the first detection sub-device 2011 is not equal to the target temperature, so that the ambient temperature reaches the target temperature; or the controller 203 is configured to control the gas flow generator 202 to inject the temperature control gas flow C into the interface A responsive to that the ambient temperature detected by the first detection sub-device 2011 is not equal to the target temperature, so that the ambient temperature reaches the target temperature. The controller 203 is further configured to control the gas flow generator 202 to generate the gas flow sealing knife B responsive to that the surface temperature of the wafer W detected by the second detection sub-device 2012 is not equal to the target temperature, so that the surface temperature reaches the target temperature, or the controller is further configured to control the gas flow generator 202 to inject the temperature control gas flow C onto the surface of the wafer W responsive to that the surface temperature of the wafer W detected by the second detection sub-device 2012 is not equal to the target temperature, so that the surface temperature reaches the target temperature. The temperature control pipeline 204 is at least in contact with the carrier table D on which the wafer is placed, and the temperature control pipeline 204 is filled with a temperature control liquid or a temperature control gas. The controller 203 is further configured to control the temperature control pipeline 204 to operate responsive to that the surface temperature detected by the second detection sub-device 2012 is not equal to the target temperature, so that the surface temperature reaches the target temperature.

In the embodiments of the present disclosure, when the photoresist coating and developing machine and the lithography machine are heated by the influence of the factory environment outside the machine and the hot gas flow of the baking unit inside the machine, the temperature control device according to the embodiments of the present disclosure is configured to monitor the temperature in time, reduce the temperature instability of the wafer at the interface, thereby reducing the temperature control time required to enter the temperature stable unit of the lithography machine. This not only ensures the timely release of the wafer stress, but also improves the authenticity and stability of the overlaying error during wafer alignment, and further reduces the process time of each wafer by reducing the temperature control time of the temperature stable unit, thereby improving the machine productivity.

Figure 8:
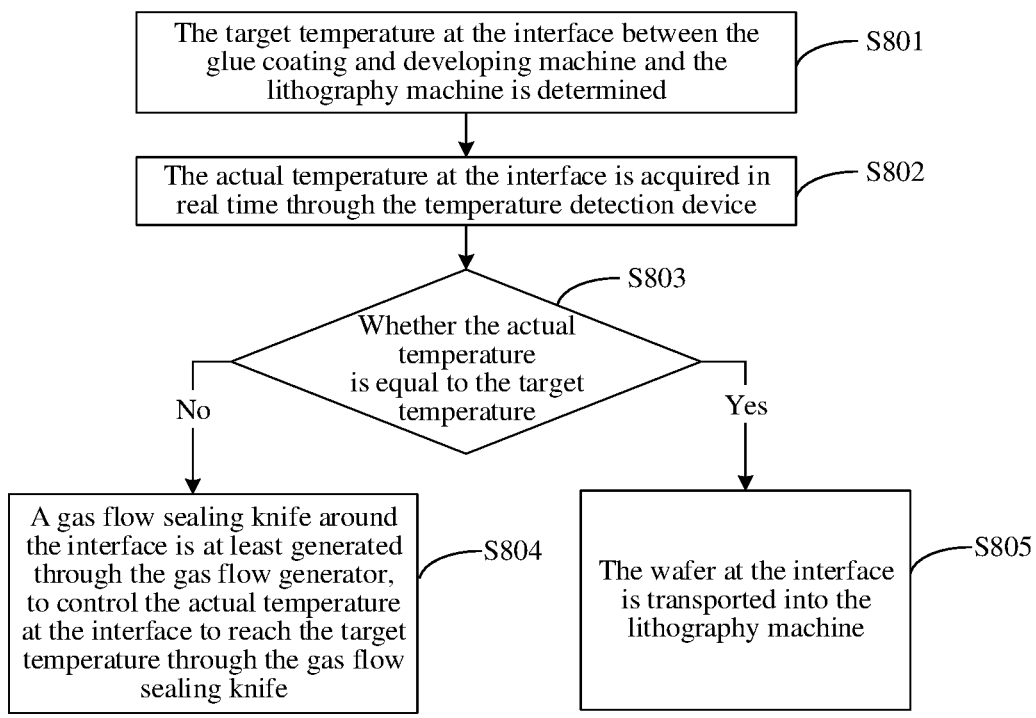
FIG. 8 illustrates a schematic flowchart of a temperature control method according to an embodiment of the present disclosure.
Figure 9:
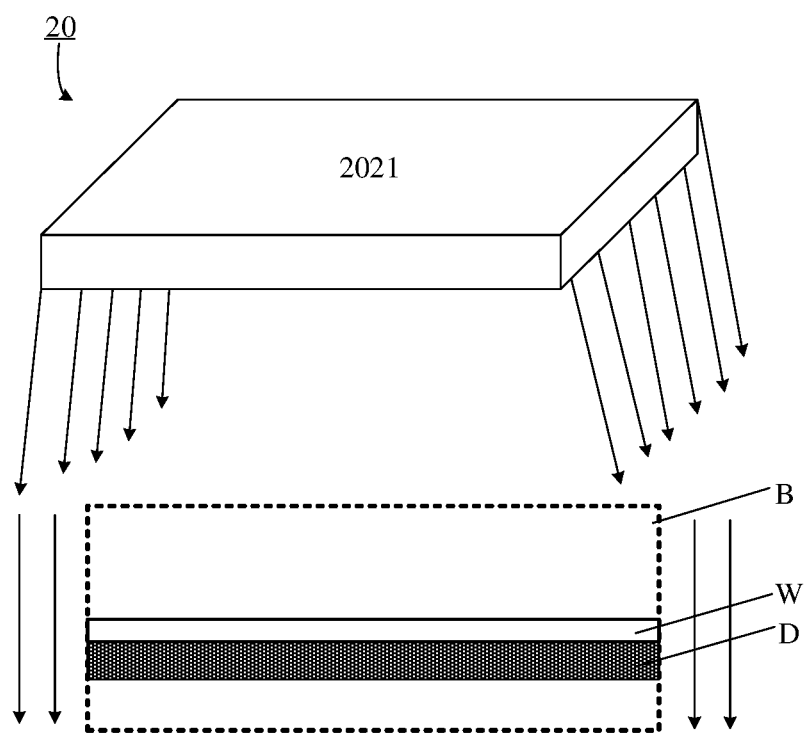
FIG. 9 illustrates another structural diagram of the temperature control device according to an embodiment of the present disclosure.

In addition, the embodiments of the present disclosure further provide a temperature control method. FIG. 8 illustrates a schematic flowchart of a temperature control method according to an embodiment of the present disclosure, and FIG. 9 illustrates another structural diagram of the temperature control device according to an embodiment of the present disclosure. The temperature control method according to the embodiments of the present disclosure is applied to the temperature control device in FIG. 9. As illustrated in FIG. 9, the temperature control device 20 includes a temperature detection device (not illustrated in the figure), an air shower device 2021 and a controller (not illustrated in the figure), and the temperature control device 20 is located at the interface between the photoresist coating and developing machine and the lithography machine.

Before implementing the temperature control method in the embodiments of the present disclosure, a design-of-experiments (DOE) experiment at different iCPL temperatures and TSU temperatures is firstly performed. Table 1 below indicates the experimental results of the DOE experiment. It can be seen from the experimental results that, when iCPL and TSU have different temperature requirements, and the set temperature at the interface is controlled under different conditions, the temperature control time of TSU is different. For the condition that the iCPL temperature is 22.1° C. and the TSU temperature is 22.2° C., by monitoring the set temperature at the interface of 22° C., the TSU time can be reduced to 11 seconds in the case that the wafer process is stable and safe. In such a way, the productivity of the lithography machine can be greatly improved.

TABLE 1

The temperature control time corresponding to the set temperature at different interfaces

| Set temperature at the interface/° C. | Ambient temperature of photoresist coating and developing machine/° C. | iCPL temperature/° C. | Temperature of the robotic arm/° C. | TSU temperature/° C. | Temperature control time/second |
|---|---|---|---|---|---|
| 21 | 23 | 21.2 | 21.6 | 22.2 | 18 |
| 21.5 | 23 | 21.7 | 21.9 | 22.2 | 13 |
| 21.8 | 23 | 21.9 | 21.9 | 22.2 | 10 |
| 21.9 | 23 | 22 | 22.1 | 22.2 | 10 |
| 22 | 23 | 22.1 | 22.2 | 22.2 | 11 |

As illustrated in FIG. 8, the temperature control method according to the embodiments of the present disclosure includes the following steps.

In S801, the target temperature at the interface between the photoresist coating and developing machine and the lithography machine is determined.

In the embodiments of the present disclosure, the target temperature is the corresponding control temperature at the interface between the photoresist coating and developing machine and the lithography machine when the stress of the wafer is the minimum and the temperature control time is the shortest when the wafer enters the lithography machine from the photoresist coating and developing machine.

In some embodiments, S801 may be formed by the following steps.

In S8011, the first preset temperature of the photoresist coating and developing machine and the second preset temperature of the lithography machine are acquired.

The first preset temperature is the control temperature required by the photoresist coating and developing machine in the current factory (that is, the iCPL temperature); the second preset temperature is the control temperature required by the lithography machine in the current factory (that is, the TSU temperature).

In S8012, a corresponding stabilization time set when the temperature of the wafer in the lithography machine reaches the second preset temperature is determined, according to the first preset temperature and the different set temperatures at the interface.

In the embodiments of the present disclosure, the set temperature is the temperature reached by a series of preset control interfaces, and the set temperature may be a set of preset gradient temperatures. According to the first preset temperature and each set temperature, the corresponding stabilization time when the temperature of the wafer in the lithography machine reaches the second preset temperature can be determined, and then the stabilization time set corresponding to each set temperature can be obtained.

In S8013, the set temperature corresponding to the shortest stabilization time in the stabilization time set is determined as the target temperature; and the overlaying error of the wafer meets the requirements at the target temperature.

In S802, the actual temperature at the interface is acquired in real time through the temperature detection device.

In some embodiments, the actual temperature includes the ambient temperature at the interface and the surface temperature of the wafer inside the interface; the temperature detection device includes a first detection sub-device and a second detection sub-device; here, the first detection sub-device and the second detection sub-device may be a temperature sensor or a temperature measuring instrument. S802 can be implemented by the following steps.

In S8021, the ambient temperature is acquired in real time through the first detection sub-device.

In S8022, the surface temperature is acquired in real time through the second detection sub-device.

In the embodiments of the present disclosure, the processes of acquiring the ambient temperature and acquiring the surface temperature of the wafer inside the interface may be performed simultaneously or not simultaneously, and there is no sequence relationship between the two.

In S803, it is determined whether the actual temperature is equal to the target temperature.

In some embodiments, the determination on whether the actual temperature is equal to the target temperature includes the following two determination processes: one is to determine whether the ambient temperature is equal to the target temperature; the other is to determine whether the surface temperature is equal to the target temperature. In some embodiments, when the ambient temperature and/or the surface temperature are not equal to the target temperature, S804 is performed, and when both the ambient temperature and the surface temperature are equal to the target temperature, S805 is performed.

In S804, the gas flow sealing knife around the interface is at least generated through the gas flow generator, to control the actual temperature at the interface to reach the target temperature through the gas flow sealing knife.

In the embodiments of the present disclosure, the gas flow sealing knife is configured to isolate the interface from the external environment, and the air pressure inside the gas flow sealing knife is greater than the air pressure of the external environment. For example, the air pressure inside the gas flow sealing knife is set to be 0.1-0.2 Pa higher than the air pressure of the photoresist coating and developing machine or lithography machine. The hot gas flow from the baking unit of the photoresist coating and developing machine and the factory is blocked by the gas flow sealing knife, and the ambient temperature inside the interface is maintained.

In some embodiments, in the case where the actual temperature is not equal to the target temperature, a temperature control gas flow may be injected to inside the interface through the gas flow generator, so that the actual temperature at the interface can be controlled by the temperature control gas flow to reach the target temperature.

In S805, the wafer at the interface is transported into the lithography machine.

In the embodiments of the present disclosure, when the actual temperature detected at the interface is equal to the target temperature, it is not necessary to adopt the temperature control device according to the embodiments of the present disclosure to control the surface temperature of the wafer at the interface and the ambient temperature at the interface, and the wafer can be transported directly into the lithography machine for subsequent pre-alignment step.

In the embodiments of the present disclosure, the DOE experiment is firstly formulated according to the iCPL temperature (corresponding to the above first preset temperature) and the TSU temperature (corresponding to the above second preset temperature) currently required in the factory, and the corresponding relationship between the TSU time (corresponding to each stabilization time in the above stabilization time set) and the temperature at the interface (corresponding to the above set temperature) is tested, to obtain the optimal temperature at the interface (corresponding to the above target temperature). Secondly, based on the existing temperature monitoring at the interface of the photoresist coating and developing machine (Track) and the lithography machine (Scanner), a cooling device is added to the channel wafer handling device (corresponding to the above carrier table on which the wafer is placed) or the load robot (corresponding to the above robotic arm inside the lithography machine) at the interface, for example, gas flow sealing knifes are added at both ends of the interface between the photoresist coating and developing machine and the lithography machine respectively, and the positive pressure inside the gas flow sealing knife (being set to be 0.1-0.2 Pa greater than the gas pressure of the photoresist coating and developing machine or the lithography machine) is ensured, to block the hot gas flow from the hot plate of the photoresist coating and developing machine and inside of the factory, and to maintain the ambient temperature inside the interface. At the same time, an air shower device is added above the interface to continuously control the temperature of the internal environment at the interface to ensure that the temperature inside the interface (including the ambient temperature and the surface temperature of the wafer) reaches the set temperature condition (that is, the target temperature).

In the embodiments of the present disclosure, when the temperature at the interface affected by the factory environment outside the machine and the hot gas flow of the baking unit inside the machine is blocked and real-time monitored, the temperature instability of the wafer at the interface is reduced, thereby reducing the temperature control time required for wafer entering the temperature stable device of the lithography machine. In this way, the timely release of the wafer stress is ensured, the authenticity and stability of the overlaying error during wafer alignment is improved and heavy work is reduced. Further, the process time of each wafer is reduced by reducing the temperature control time of the temperature stabilizing device of the lithography machine, and the machine productivity is improved.

In some embodiments, the temperature control device further includes a temperature control pipeline. The method further includes the following operations.

In the case where the actual temperature is not equal to the target temperature, the surface temperature of the wafer is controlled to reach the target temperature through the temperature control pipeline.

Please continue to refer to FIG. 9, a vacuum suction cup (not illustrated in the figure) is set in the center of the carrier table D under the chuck for carrying the wafer W at the interface between the photoresist coating and developing machine and the lithography machine, to fix the wafer, and the air shower device 2021 is set above the interface, and the air shower device 2021 is configured to form a gas flow sealing knife B with internal positive pressure at the interface to block the hot gas flow from the hot plate of the photoresist coating and developing machine and the inside of the factory, maintain the internal ambient temperature at the interface, generate a temperature control gas flow (the gas flow shown by the arrow in FIG. 9) through air shower device 2021, and continuously control the temperature of the environment at the interface so as to ensure that the set temperature condition (that is, the target temperature) is reached at the interface.

The temperature control method in the embodiments of the present disclosure is similar to the temperature control device in the above embodiments. For the technical features not disclosed in detail in the embodiments of the present disclosure, please refer to the above embodiments for understanding, which will not be repeated here.

By the temperature control method according to the embodiments of the present disclosure, the wafer at the interface between the photoresist coating and developing machine and the lithography machine have a suitable temperature, thereby reducing the temperature control time of the wafer in the TSU and improving the productivity of the lithography machine.

In the several embodiments provided in the present disclosure, it should be understood that the disclosed apparatus and method may be implemented in a non-target manner. The device embodiments described above are only illustrative. For example, the division of the units is only a logical function division. In actual implementation, there may be other division manners. For example, a plurality of units or components may be combined, or can be integrated into another system, or some features can be ignored, or are not implemented. In addition, the various components shown or discussed are coupled to each other, or directly coupled to each other.

The features disclosed in several method or device embodiments provided in the present disclosure can be combined arbitrarily without conflict to obtain new method embodiments or device embodiments.

The above descriptions are only some implementations of the embodiments of the present disclosure, but the protection scope of the embodiments of the present disclosure is not limited thereto. Any person skilled in the art would easily conceive of changes or substitutions within the technical scope disclosed by the embodiments of the present disclosure, which should be covered by the protection scope of the embodiments of the present disclosure. Therefore, the protection scope of the embodiments of the present disclosure should be subject to the protection scope of the claims.

The invention claimed is:

1. A temperature control device, located at an interface between a photoresist coating and developing machine and a lithography machine; wherein the temperature control device comprises: a temperature detection device, a gas flow generator and a controller;
   the temperature detection device and the gas flow generator are respectively connected to the controller;
   the temperature detection device is configured to detect an actual temperature at the interface in real time;
   the gas flow generator is at least configured to generate a gas flow sealing knife around the interface; and
   the controller is configured to control the gas flow generator to generate the gas flow sealing knife responsive to the actual temperature detected by the temperature detection device being not equal to a target temperature at the interface, to control the actual temperature at the interface to reach the target temperature through the gas flow sealing knife,
   wherein the target temperature at the interface is determined by the following process:
   acquiring a first preset temperature of the photoresist coating and developing machine and a second preset temperature of the lithography machine;
   determining, according to the first preset temperature and different set temperatures at the interface, a corresponding stabilization time set when a temperature of a wafer in the lithography machine reaches the second preset temperature; and
   determining a set temperature corresponding to a shortest stabilization time in the corresponding stabilization time set as the target temperature; wherein an overlaying error of the wafer meets requirements at the target temperature.

2. The temperature control device according to claim 1, wherein the gas flow sealing knife is configured to isolate the interface from an external environment, and an air pressure inside the gas flow sealing knife is greater than an air pressure of the external environment.

3. The temperature control device according to claim 2, wherein the gas flow generator is located at a top inside the interface and is further configured to inject a temperature control gas flow to inside the interface;
   the controller is further configured to control the gas flow generator to inject the temperature control gas flow to inside the interface responsive to the actual temperature detected by the temperature detection device being not equal to the target temperature at the interface, to control the actual temperature at the interface to reach the target temperature through the temperature control gas flow.

4. The temperature control device according to claim 3, wherein the gas flow generator comprises an air shower device or a fan.

5. The temperature control device according to claim 1, wherein the actual temperature comprises an ambient temperature at the interface and a surface temperature of the wafer inside the interface;
   the temperature detection device comprises a first detection sub-device and a second detection sub-device;

wherein the first detection sub-device is configured to detect the ambient temperature; and the second detection sub-device is configured to detect the surface temperature.

6. The temperature control device according to claim 5, wherein the controller is connected to the first detection sub-device;
the controller is further configured to control the gas flow generator to generate the gas flow sealing knife responsive to the ambient temperature detected by the first detection sub-device being not equal to the target temperature at the interface, so that the ambient temperature reaches the target temperature; or,
the controller is further configured to control the gas flow generator to inject a temperature control gas flow to inside the interface responsive to the ambient temperature detected by the first detection sub-device being not equal to the target temperature at the interface, so that the ambient temperature reaches the target temperature.

7. The temperature control device according to claim 5, wherein the controller is connected to the second detection sub-device;
the controller is further configured to control the gas flow generator to generate the gas flow sealing knife responsive to the surface temperature detected by the second detection sub-device being not equal to the target temperature at the interface, so that the surface temperature reaches the target temperature; or,
the controller is further configured to control the gas flow generator to inject a temperature control gas flow onto a surface of the wafer responsive to the surface temperature detected by the second detection sub-device being not equal to the target temperature at the interface, so that the surface temperature reaches the target temperature.

8. The temperature control device according to claim 5, wherein the temperature control device further comprises: a temperature control pipeline; the temperature control pipeline being filled with a temperature control liquid or a temperature control gas;
the temperature control pipeline being at least in contact with a carrier table on which the wafer is placed, and the temperature control pipeline being connected to the controller; and
wherein the controller is further configured to control the temperature control pipeline to operate responsive to the surface temperature detected by the second detection sub-device being not equal to the target temperature at the interface, so that the surface temperature reaches the target temperature.

9. The temperature control device according to claim 8, wherein the temperature control liquid comprises water; and the temperature control gas comprises compressed gas.

10. A temperature control method, applied to a temperature control device located at an interface between a photoresist coating and developing machine and a lithography machine, the temperature control device at least comprising: a temperature detection device and a gas flow generator; wherein the method comprises:
determining a target temperature at the interface between the photoresist coating and developing machine and the lithography machine;
acquiring an actual temperature at the interface in real time through the temperature detection device; and
at least generating a gas flow sealing knife around the interface through the gas flow generator in the case where the actual temperature is not equal to the target temperature, to control the actual temperature at the interface to reach the target temperature through the gas flow sealing knife,
wherein the determining a target temperature at the interface between the photoresist coating and developing machine and the lithography machine comprises:
acquiring a first preset temperature of the photoresist coating and developing machine and a second preset temperature of the lithography machine;
determining, according to the first preset temperature and different set temperatures at the interface, a corresponding stabilization time set when a temperature of a wafer in the lithography machine reaches the second preset temperature; and
determining a set temperature corresponding to a shortest stabilization time in the corresponding stabilization time set as the target temperature; wherein an overlaying error of the wafer meets requirements at the target temperature.

11. The temperature control method according to claim 10, wherein the gas flow sealing knife is configured to isolate the interface from an external environment, and an air pressure inside the gas flow sealing knife is greater than an air pressure of the external environment.

12. The temperature control method according to claim 11, further comprising:
injecting a temperature control gas flow to inside the interface through the gas flow generator in the case where the actual temperature is not equal to the target temperature, to control the actual temperature at the interface to reach the target temperature through the temperature control gas flow.

13. The temperature control method according to claim 11, wherein the temperature control device further comprises: a temperature control pipeline; the method further comprises:
controlling a surface temperature of the wafer to reach the target temperature through the temperature control pipeline, in the case where the actual temperature is not equal to the target temperature.

14. The temperature control method according to claim 10, wherein the actual temperature comprises an ambient temperature at the interface and a surface temperature of the wafer inside the interface; the temperature detection device comprises a first detection sub-device and a second detection sub-device;
the acquiring an actual temperature at the interface in real time through the temperature detection device comprises:
acquiring the ambient temperature in real time through the first detection sub-device; and
acquiring the surface temperature in real time through the second detection sub-device.

15. The temperature control method according to claim 14, further comprising:
generating the gas flow sealing knife around the interface through the gas flow generator in the case where the ambient temperature is not equal to the target temperature, so that the ambient temperature at the interface reaches the target temperature; or,
injecting a temperature control gas flow to inside the interface through the gas flow generator in the case where the ambient temperature is not equal to the target temperature, so that the ambient temperature at the interface reaches the target temperature.

16. The temperature control method according to claim 14, further comprising:

generating the gas flow sealing knife around the interface through the gas flow generator in the case where the surface temperature is not equal to the target temperature, so that the surface temperature reaches the target temperature; or, injecting a temperature control gas flow onto a surface of the wafer through the gas flow generator in the case where the surface temperature is not equal to the target temperature, so that the surface temperature reaches the target temperature.

* * * * *